(12) United States Patent
Sridhar et al.

(10) Patent No.: US 6,461,888 B1
(45) Date of Patent: Oct. 8, 2002

(54) LATERAL POLYSILICON BEAM PROCESS

(75) Inventors: Uppili Sridhar, Singapore (SG); Ranganathan Nagarajan, Singapore (SG); Yubo Miao, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/880,249

(22) Filed: Jun. 14, 2001

(51) Int. Cl.[7] .............................................. H01L 21/00
(52) U.S. Cl. ............................ 438/52; 438/50; 438/51; 438/53
(58) Field of Search ............................. 438/50, 51, 52, 438/53

(56) References Cited

U.S. PATENT DOCUMENTS

| | | | |
|---|---|---|---|
| 5,563,343 A | 10/1996 | Shaw et al. | 73/514.18 |
| 5,660,680 A | 8/1997 | Keller | 438/50 |
| 5,930,595 A | 7/1999 | Sridhar et al. | 438/52 |
| 6,035,714 A | 3/2000 | Yazdi et al. | 73/514.32 |
| 6,133,670 A | 10/2000 | Rodgers et al. | 310/309 |
| 6,171,881 B1 | 1/2001 | Fujii | 438/52 |
| 6,175,170 B1 | 1/2001 | Kota et al. | 310/40 MM |

OTHER PUBLICATIONS

Farrokh Ayazi et al., "A HARPSS Polysilicon Vibrating Ring Gyroscope," Inst. of Microelectronics, Journal of Mictoelectro–mechanical Systems, vol. 10, No. 2, Jun. 2001, pp. 169–179.

Farrokh Ayazi et al., "High Aspect–Ratio Combined Poly and Single–Crystal Silicon (HARPSS) MEMS Technology," Inst. of Microelectronics, Jrnl. of Microelectro–mechanical Systems, vol. 9, No. 3, Sep. 2000, pp. 288–291.

E. Klassen et al., "Silicon Fusion Bonding and Deep Reactive Ion Etching; A New Technology For Microstructures", Transducers '95, Stockholm, Sweden, 1995, pp. 556–559.

*Primary Examiner*—David Nelms
*Assistant Examiner*—Dung Anh Le
(74) *Attorney, Agent, or Firm*—George O. Saile; Stephen B. Ackerman

(57) ABSTRACT

A process has been described which makes use of polysilicon beam as the structural material instead of single crystal silicon for the fabrication of MEMS sensors/actuators. The invention describes the process for fabricating suspended polysilicon beams by using deep trenches etched into silicon substrate as a kind of a mould to form polysilicon beams. The polysilicon beams are subsequently released by isotropically etching away the silicon surrounding the polysilicon beams. This results in free standing polysilicon members, which form the MEMS structures. In addition to the general process, three approaches to making electrical contact to the beams are presented.

27 Claims, 11 Drawing Sheets

LATERAL POLYSILICON BEAM PROCESS

FIELD OF THE INVENTION

The invention relates to the general field of MEMS structures with particular reference to cantilever beams.

BACKGROUND OF THE INVENTION

MEMS (micro electromechanical systems) sensors and actuators, such as accelerometers, pressure sensors, and gyroscopes are manufactured using either a bulk micromachining process or a surface micromachining process. "Bulk" micromachining refers to structures formed by deep anisotropic etching. "Surface" micromachining refers to structures formed from thin film layers deposited or grown on the surface of a substrate. Surface micromachining has advantages over the previous bulk micromachining process of fabricating IC sensors and actuators because it permits smaller devices and may be integrated with other circuits on an IC (integrated circuit). One form of bulk micromachining typically involves etching in a silicon substrate deep trenches between 10 microns to 100 microns deep. The resulting silicon structures (called "beams") are partially released (i.e., detached) from the silicon substrate by known processes such as wet or dry etching. This deep trench technology is described, for example, in Klaassen, et al. "Fusion Bonding and Deep Reactive Ion Etching: A New Technology for Microstructures", Transducers '95, Stockholm, Sweden, 1995. The contents of this article are incorporated herein by reference.

A variety of methods that have been discussed in the literature have been devised for fabricating micromachined structures such as accelerometers. However, most such processes require multiple masking steps, wafer-to-wafer bonding, or the use of wet chemistry. It has been found, however, that the use of such multiple masks and bonding techniques can introduce alignment errors, which reduce yield and increase device cost, making such processes unsuitable for submicron structures.

A routine search of the prior art was performed with the following references of interest being found:

U.S. Pat. No. 5,930,595 (Isolation process for surface micromachined sensors and actuators) discusses a method of fabricating MEMS sensors/actuators using a process wherein deep trenches are etched and released beams formed by using oxide spacer to protect beam sidewall. The key feature of this patent is that it provides a novel method of forming trenches which are filled with isolation oxide so as to form silicon islands on three sides while the fourth side is connected to the sensor/actuator beams. Recently, another patent application has been filed in IME, namely, "A High Aspect Ratio Trench Isolation Process for Surface Micromachined Sensor and Actuators (PAT00-005/MEMS001)" which uses a novel process to form an isolation island that can be used in fabrication of MEMS sensors/actuators.

U.S. Pat. No. 5,563,343 describes a method of fabricating accelerometers utilizing a modified version of the Single Crystal Reactive Etching. And Metallization (SCREAM) process which is also described in U.S. application Ser. No. 08/013,319, filed Feb. 5, 1993. As stated in that application, the SCREAM-I process is a single mask, single wafer, dry etch process which uses optical lithography for fabricating submicron micro-electromechanical devices. In that process, a silicon dioxide layer is deposited on a single crystal silicon wafer, this oxide layer serving as the single etch mask throughout the process. Photolithography is used to pattern a resist, and then dry etching, such as magnetron ion etching, is used to transfer the pattern of the accelerometer structure into the oxide. Once the resist material is removed, the patterned oxide masks the silicon substrate to allow a deep vertical silicon RIE (reactive ion etching) on exposed surfaces to produce trenches having predominately vertical side walls and which define the desired structure.

Next, a conformal coating of PECVD oxide is deposited for protecting the side walls of the trenches during the following release etch. The trench bottom oxide is removed within an isotropic RIE, and a second deep silicon trench etch deepens the trenches to expose the sidewall silicon underneath the deposited side wall oxide. The exposed silicon underneath the defined structure is etched away, using an isotropic dry etch such as an SF6 etch to release the structure and leave cantilevered beams and fingers over the remaining substrate. In the SCREAM-I process, aluminium is deposited by sputtering to coat the sidewall of the released beams and fingers to thereby form the capacitor plates for the accelerometer.

In U.S. Pat. No. 6,035,714, a high sensitivity, Z-axis capacitive micro-accelerometer having stiff sense/feedback electrodes and a method of its manufacture are provided. The micro-accelerometer is manufactured out of a single silicon wafer and has a sili-con-wafer-thick proofmass, small and controllable damping, large capacitance variation and can be operated in a force-rebalanced control loop. The multiple stiffened electrodes have embedded therein-amping holes to facilitate both force-rebalanced operation of the device and controlling of the damping factor. Using the whole silicon wafer to form the thick large proofmass and using the thin sacrificial layer to form a narrow uniform capacitor air gap over a large area provide large capacitance sensitivity. The structure of the micro-accelerometer is symmetric and thus results in low cross-axis sensitivity.

In U.S. Pat. No. 5,660,680, a method of forming polysilicon structures using silicon trenches with partially trench-filled oxide as molds has been described. The oxide layer acts as the sacrificial layer to release the polysilicon structures.

BOSCH Polysilicon (Epi-poly) process: This process makes use of thick epitaxial polysilicon (20–30 microns) grown on a silicon substrate. This poly layer is then used in forming beams of various depths for forming MEMS structures. This process uses an epi reactor and hence is quite expensive. For thick poly, residual stress is still a potential issue.

Additional references of interest were:

U.S. Pat. No. 6,133,670 (Rodgers) shows a poly beam (finger) in a MEMS device. In U.S. Pat. No. 6,175,170 B1, Kota et al. show another poly finger MEMS device and process while, in U.S. Pat. No. 6,171,881 B1, Fujii shows another MEMS device.

SUMMARY OF THE INVENTION

It has been an object of the present invention to provide a cost-effective process for manufacturing IC sensors and/or actuators that completely electrically isolates the sensor beams from the substrate that supports them.

Another object of the present invention has been to provide a process for manufacturing IC sensors and/or actuators that have low parasitic capacitance.

Yet another object of the present invention has been to provide a process for manufacturing IC sensors and/or actuators that is compatible with CMOS processes.

These objects have been achieved by providing a process which makes use of polysilicon beam as the structural material instead of single crystal silicon for the fabrication of MEMS sensors/actuators. The invention describes the process for fabricating suspended polysilicon beams by using deep trenches etched into silicon substrate as molds to form polysilicon beams. The polysilicon beams are subsequently released by isotropically etching away the silicon surrounding the polysilicon beams. This results in free standing polysilicon members, which form the MEMS structures. In addition to the general process, three approaches to making electrical contact to the beams are presented.

BRIEF DESCRIPTION OF THE DRAWINGS

FIG. 9 is a plan view of which FIG. 8 is a cross-section.

DESCRIPTION OF THE PREFERRED EMBODIMENTS

Most of the prior art described above make use of a deep trench etch process to define the beams and subsequently release the silicon beams while using oxide spacers to protect the sidewalls. This press has the following limitations:

It is difficult to get a conformal spacer layer for high aspect ratio trenches (>20). This makes it difficult to protect beam sidewalls during pre-release and final release etch. This makes the beam sidewall very irregular due to 'mouse bites' at these sites. In order to solve this problem, thicker spacer oxide is deposited. This in turn compels designers to widen the trench openings thus reducing the sensitivity of the actuator/sensor.

The release etch process after releasing the beams, further erodes the beam thus reducing the beam depth. This results in Joss of beam depth across the wafer. The sidewall spacer also hangs like a tail where the beams have been encroached. This oxide tails act as a potential sources of contamination due to their flimsy nature. During operation they may even break off and be redeposited between the sensing fingers, causing devices to behave unpredictably.

In the case of the SCREAM process, a metal layer is deposited over the beams to make the sensor/actuator beams conductive. However, it is not possible to get conformal aluminum deposition inside deep trenches.

We now provide a detailed description of the process of the present invention, presented as four embodiments thereof:

1$^{st}$ Embodiment (general process)

Figure 1:
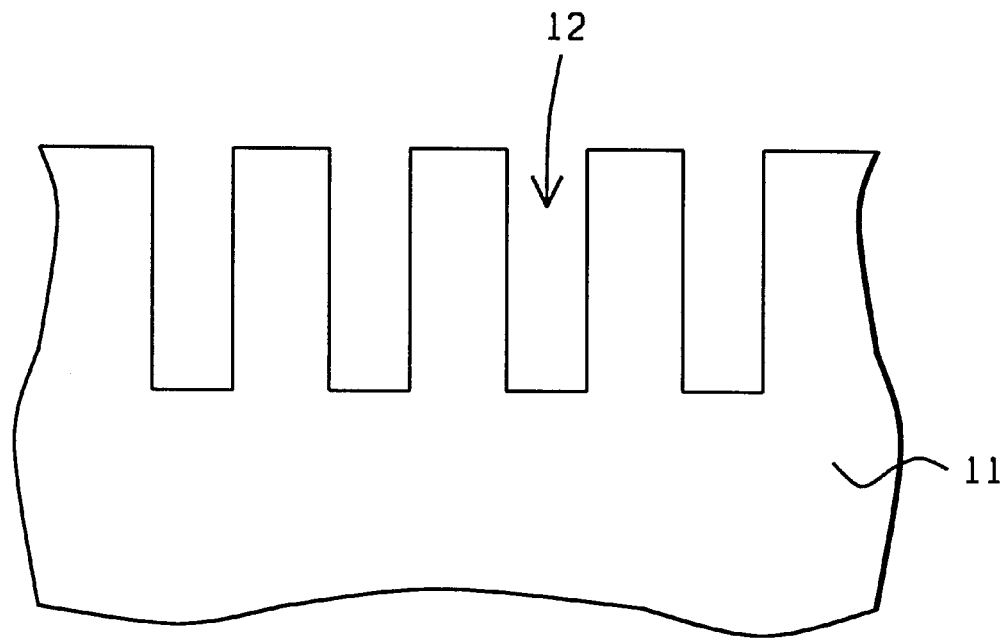
FIGS. 1–4 illustrate how trenches may be etched, lined with insulation and then filled with polysilicon.
Figure 2:
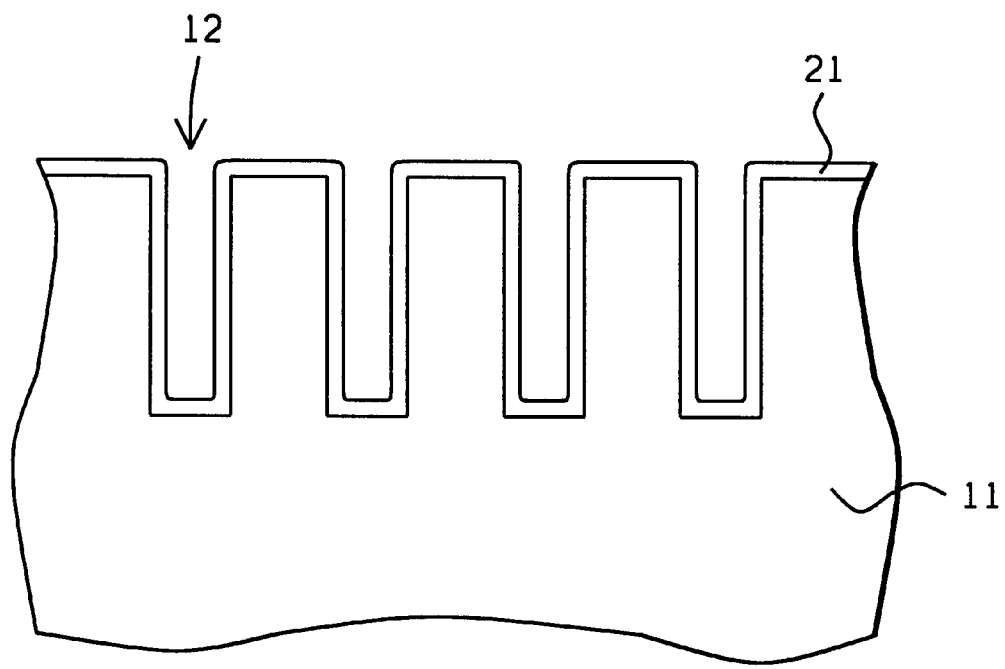

Referring to FIG. 1 we show there a schematic cross-section of solid body 11 (preferably, but not necessarily, of silicon, with other possibilities including other semiconductors and metals such as aluminum, copper, gold, etc. in which deep trenches such as 12 have been etched to a depth between about 60 and 70 microns. As shown in FIG. 2, the floors and sidewalls of these trenches are then coated with a layer of an insulating material 21 which could be any of several possible materials such as silicon oxide, silicon nitride, etc., with silicon oxide being preferred.

Figure 3:
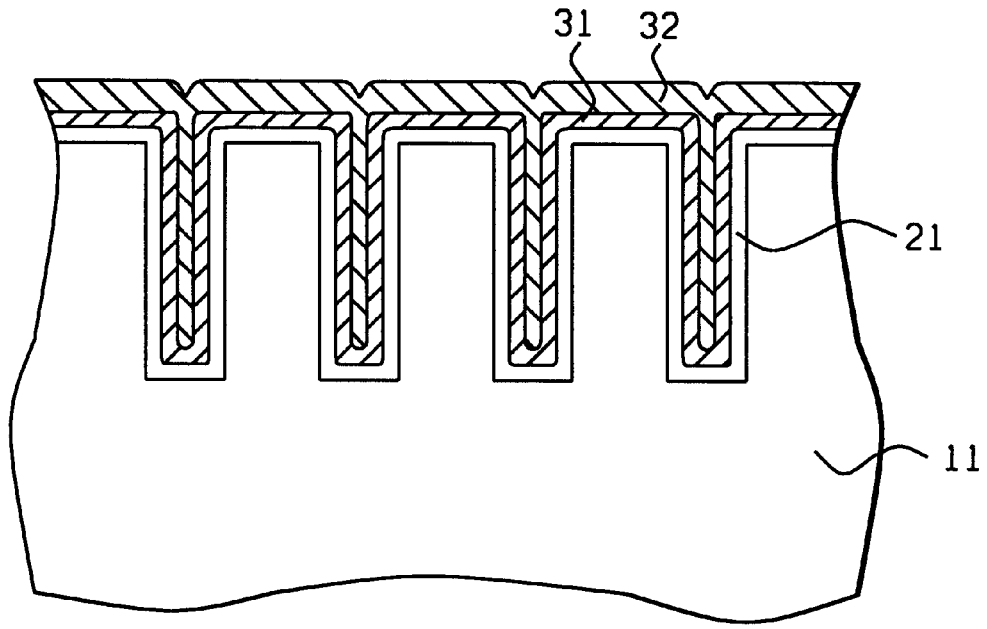

The trenches are then just filled (by overfilling and then planarizing) with one or more layers of conductive material. Although only a single conductive filling material such as polysilicon, aluminum, copper, gold, etc. could be used, our preferred process has been to first under-fill with low resistivity (achieved by doping with phosphorus oxychloride) polysilicon layer 31 followed by overfilling with polysilicon layer 32, as shown in FIG. 3. Layer 31 of polysilicon is deposited to a stress level that is below about $-1 \times 10^8$ dynes per sq. cm while the second layer of polysilicon is deposited to a stress level that is below this. The first deposited layer of polysilicon had a resistivity between about 10 and 12 ohm-cm while the second layer of polysilicon had a resistivity between about 11 and 13 ohm-cm, after an annealing cycle to distribute the phosphorus uniformly across the thickness of the polysilicon.

It is also possible, in principle to fill the trenches with a magnetic material for use in, for example, detecting and measuring magnetic fields. In general, filling of the trenches with conductive material may be implemented using any of the known methods for doing so, including chemical vapor deposition, physical vapor deposition, and electroplating.

Figure 4:
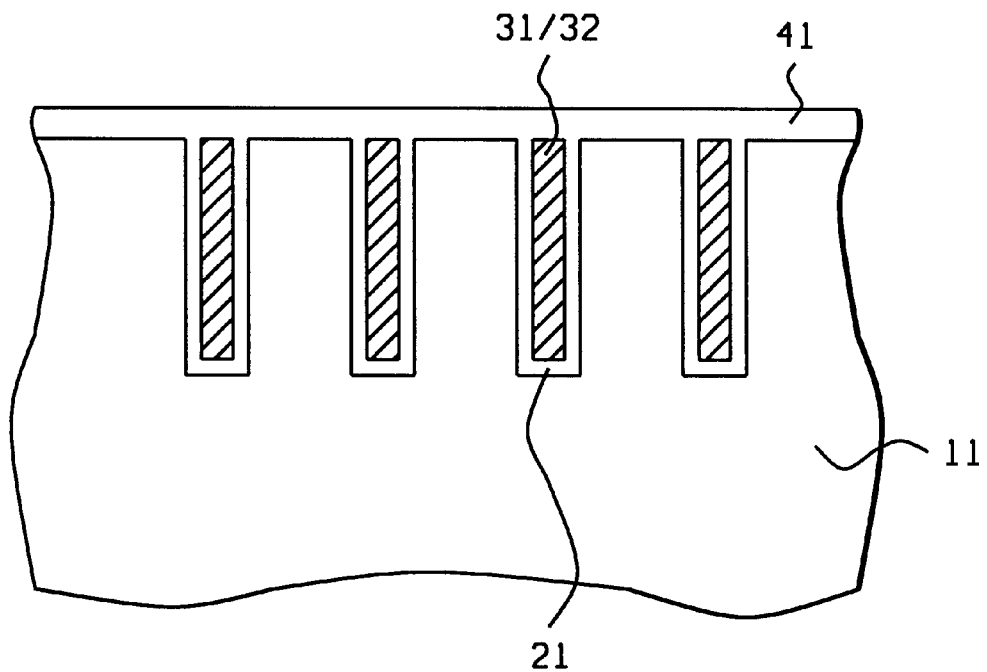

The next step, as illustrated in FIG. 4, is the deposition of insulating layer 41 over the entire surface. A mask 51 is then formed on the surface of layer 41. This mask serves to protect the filled trenches 31/32 as well as to define an opening, said opening being disposed so that the filled trenches lie partly inside and partly outside it. Then, through mask 51, conductive body 11 is etched to form a cavity 61 (see FIG. 6) that extends downwards to a depth between about 75 and 80 microns so that it is greater than the depth of the filled trenches, resulting in the formation of pedestals.

Figure 7:
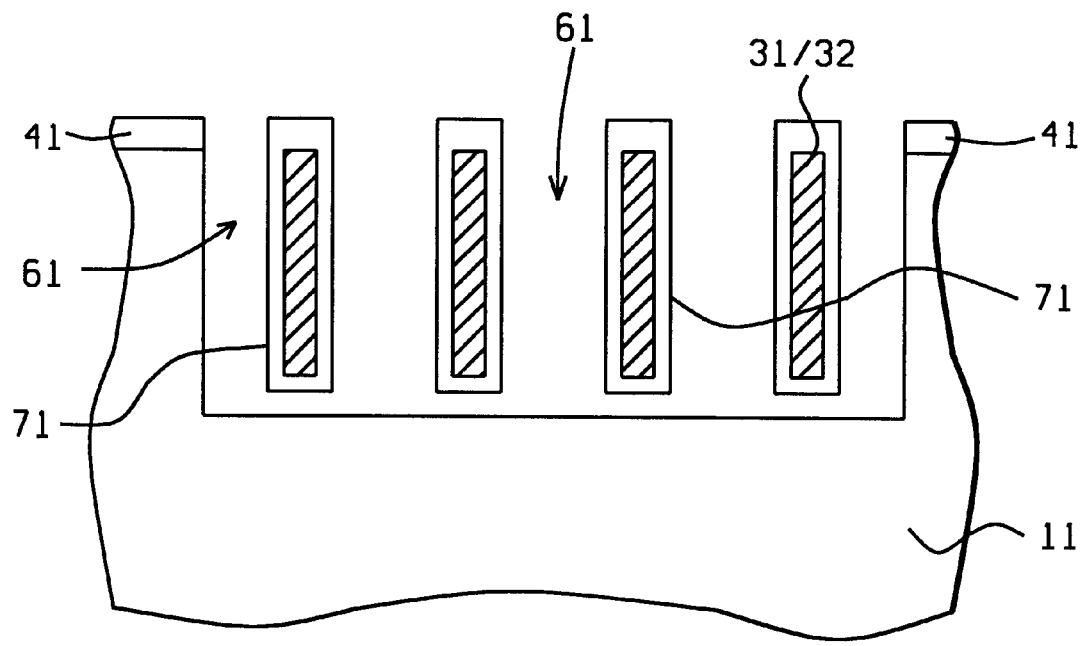
FIGS. 7 and 8 are cross-sectional views of the cantilever beams that are formed after the pedestals are released from the cavity floor.
Figure 8:
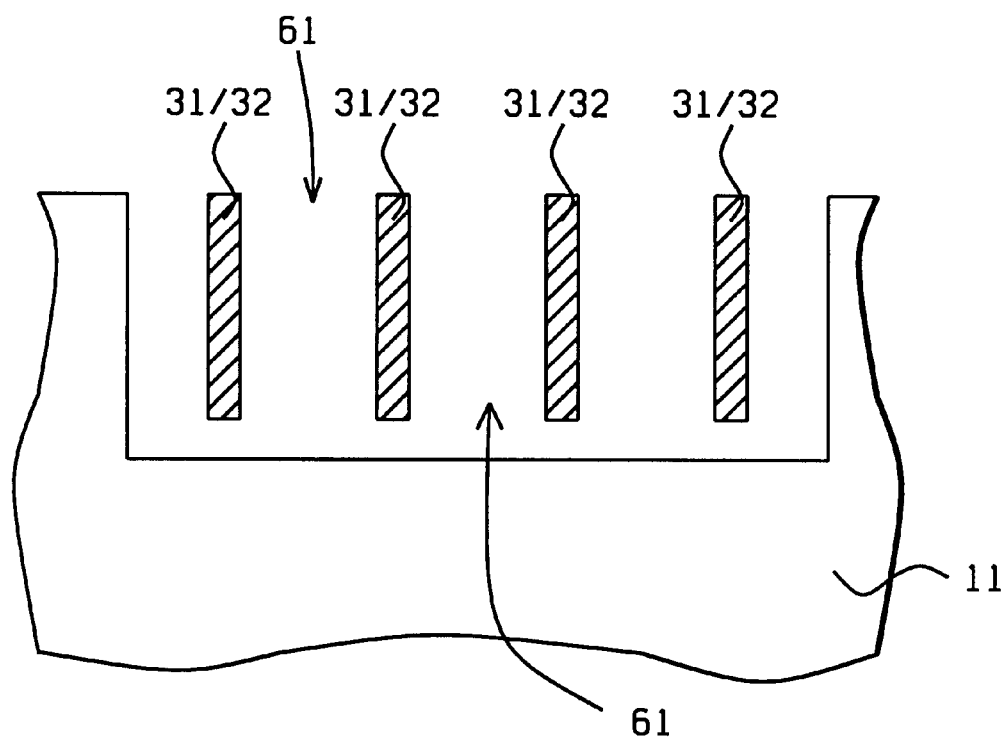
Figure 9:
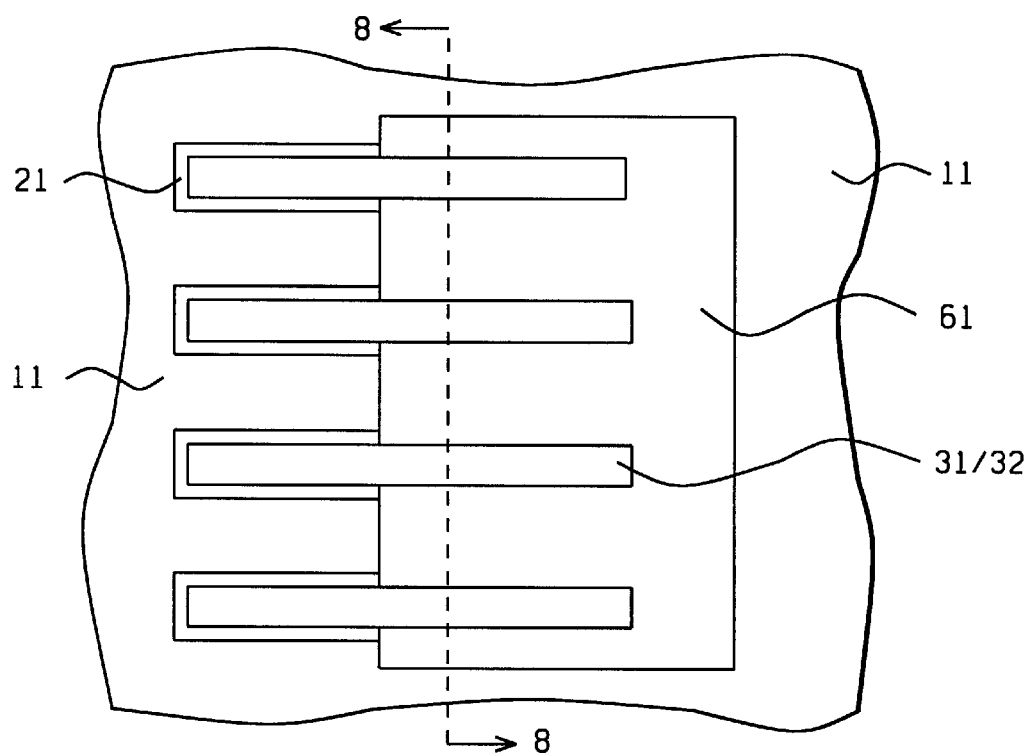

With mask still in place, all exposed conductive material is removed, using a release etch, which results in the formation of cantilever beams 71, as shown in FIG. 7 (seen following the removal of mask 51). This is followed by the selective removal of all exposed insulating material as shown in FIG. 8. FIG. 9 is a plan view, with FIG. 8 being a cross-section made through 8—8. As can be seen in this example, four cantilever beams 31/32 extend away from conductive body 11 and are suspended within cavity 61. They are physically embedded in conductive body 11 but are electrically insulated from it by insulating layer 21.

Three different ways of then making electrical contact to the beam are the basis for the next three embodiments:

2$^{nd}$ Embodiment (busbar island formation)

Figure 14:
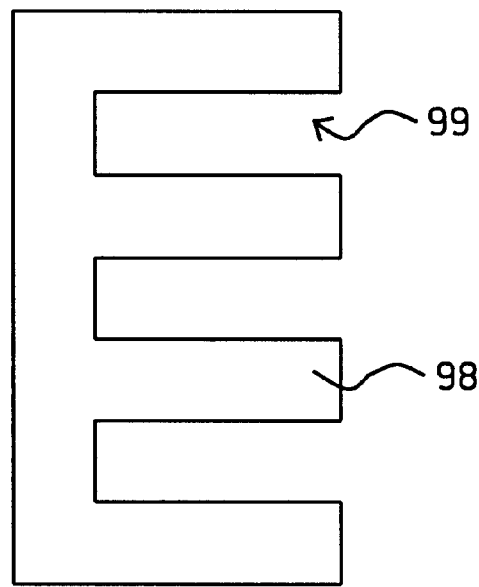
FIGS. 14–15 illustrate the formation of the busbar island area.
Figure 18:
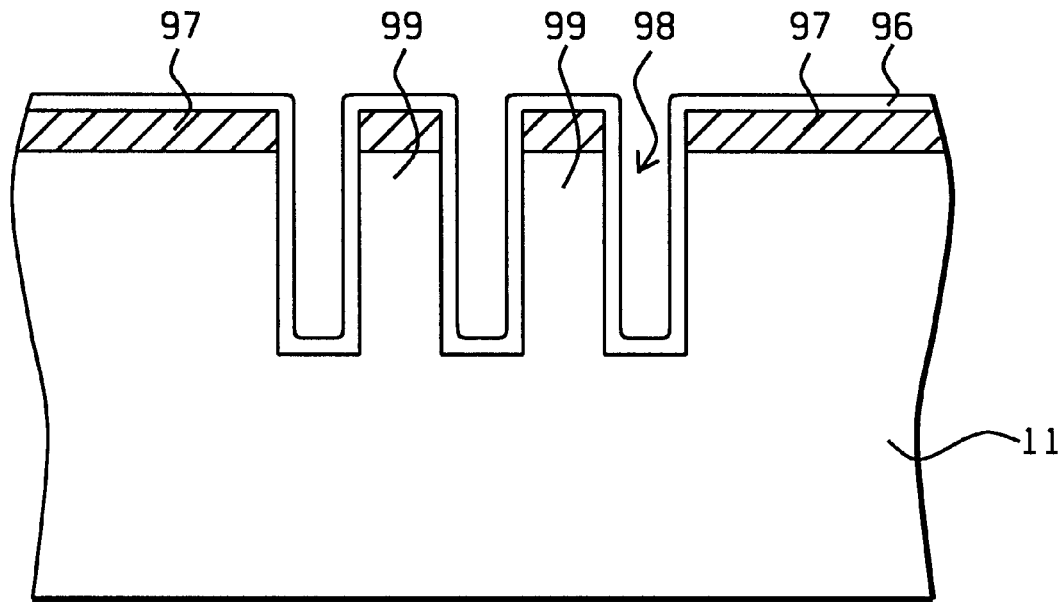
Figure 19:
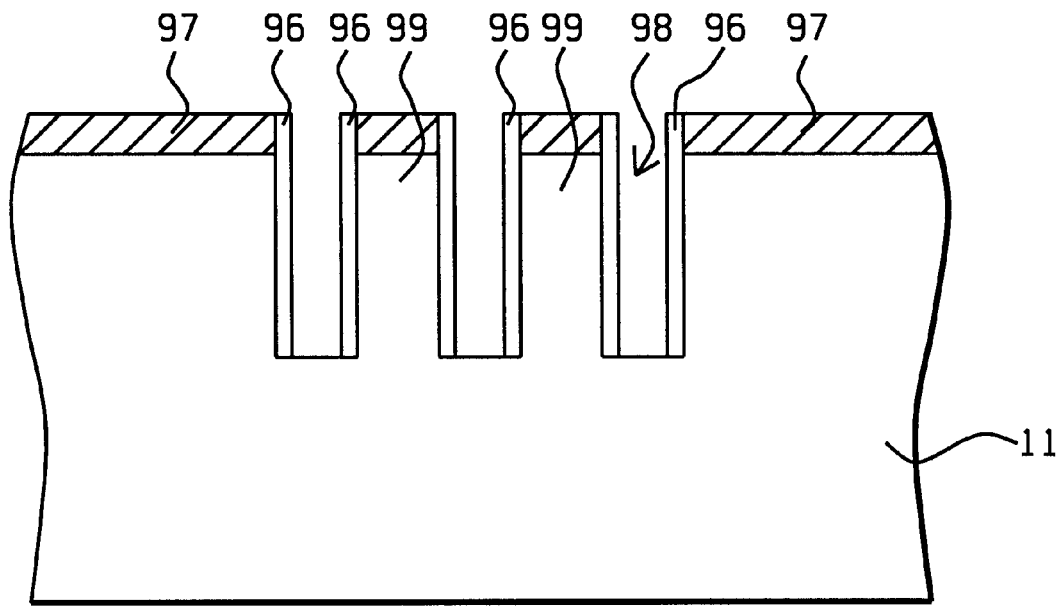

This embodiment uses the general process of the first embodiment with the following additional steps:

We refer now to FIG. 14 which is a plan view of the cross-section shown in FIG. 18. Prior to starting the general process, layer of silicon oxide 97 (see FIG. 18) is deposited on the upper surface to a thickness between about 2 and 3 microns and then patterned to form a busbar island mask. Silicon substrate 11 is then etched to form trenches 98 to a depth between about 60 and 70 microns.

Figure 20:
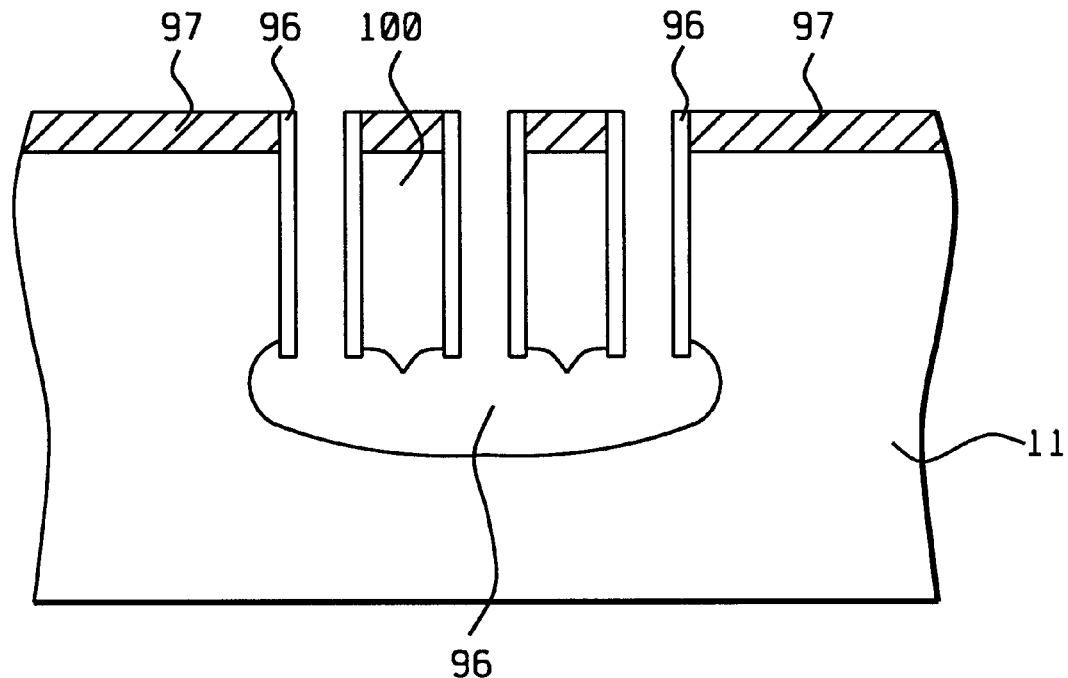
FIG. 20 illustrates beam release within the busbar island area.
Figure 21:
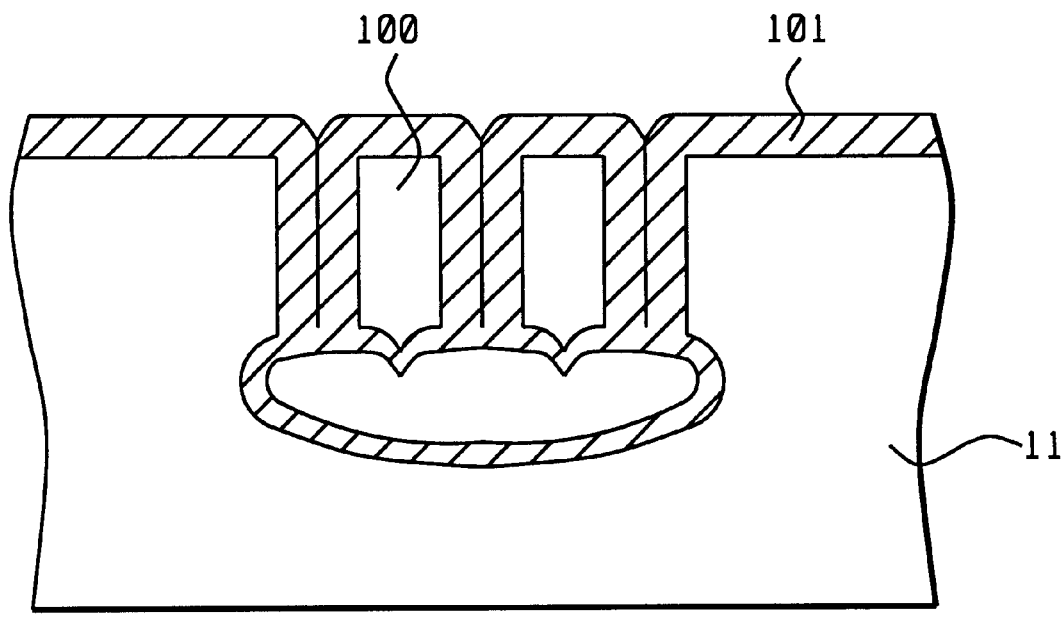
FIG. 21 shows how space between the beams of FIG. 20 gets filled with oxide.

Layer of silicon oxide 96 (5–7,000 Å thick) is deposited and then etched-back using RIE as shown in FIGS. 18 and. Using an isotropic release etch silicon beam 99 is released to form the suspended silicon beams 100 as shown in FIGS. 20 and 21.

Figure 10:
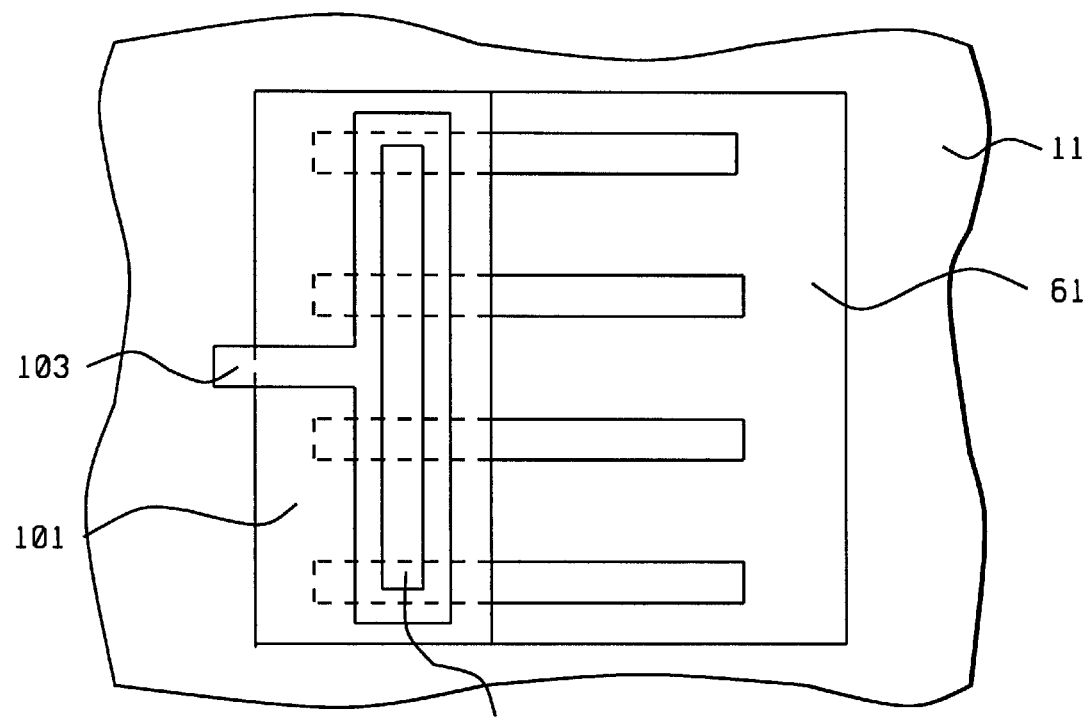
FIG. 10 illustrates the first of three embodiments that teach how electrical contact may be made to the cantilever beams.
Figure 15:
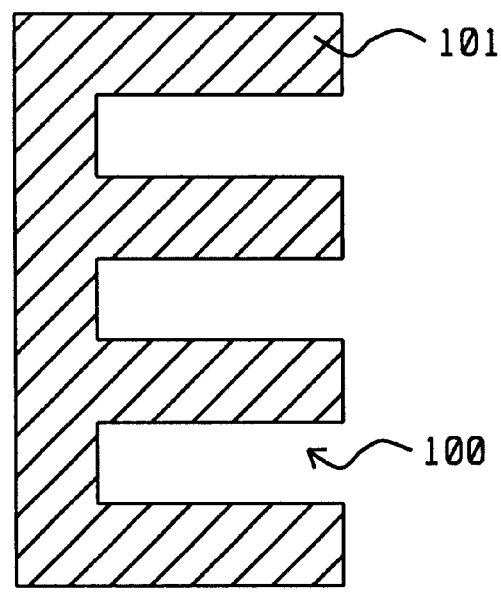
Figure 16:
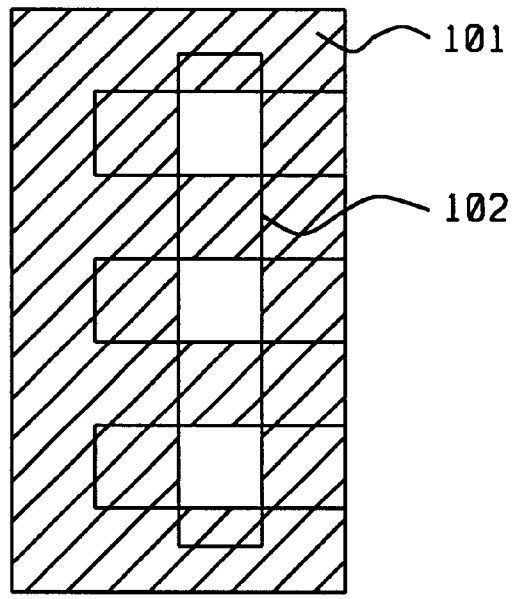
FIG. 16 is a plan view of three silicon beams connected through a busbar mask.
Figure 17:
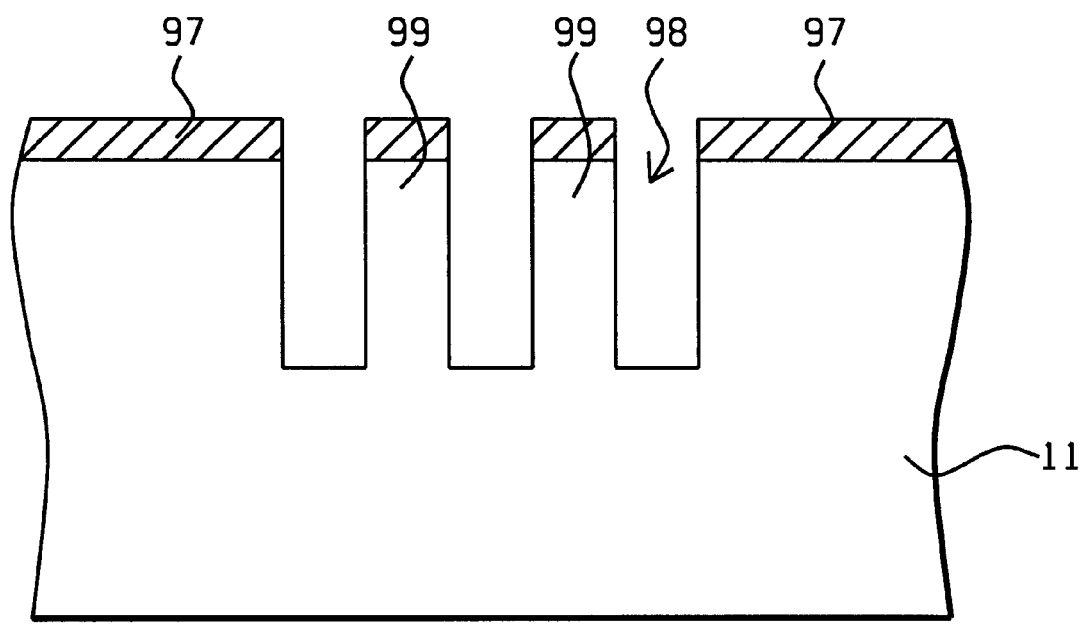
FIGS. 17–19 illustrate steps in the formation of the busbar island mask.

Later, silicon oxide is deposited to fill the trenches as shown in FIGS. 15 and 16. Using contact mask 102 and metal mask 103, an electrical connection is made between the interconnect metal and busbar silicon 100 on polysilicon beam 31/32 as seen in FIGS. 10 and 16.

Figure 5:
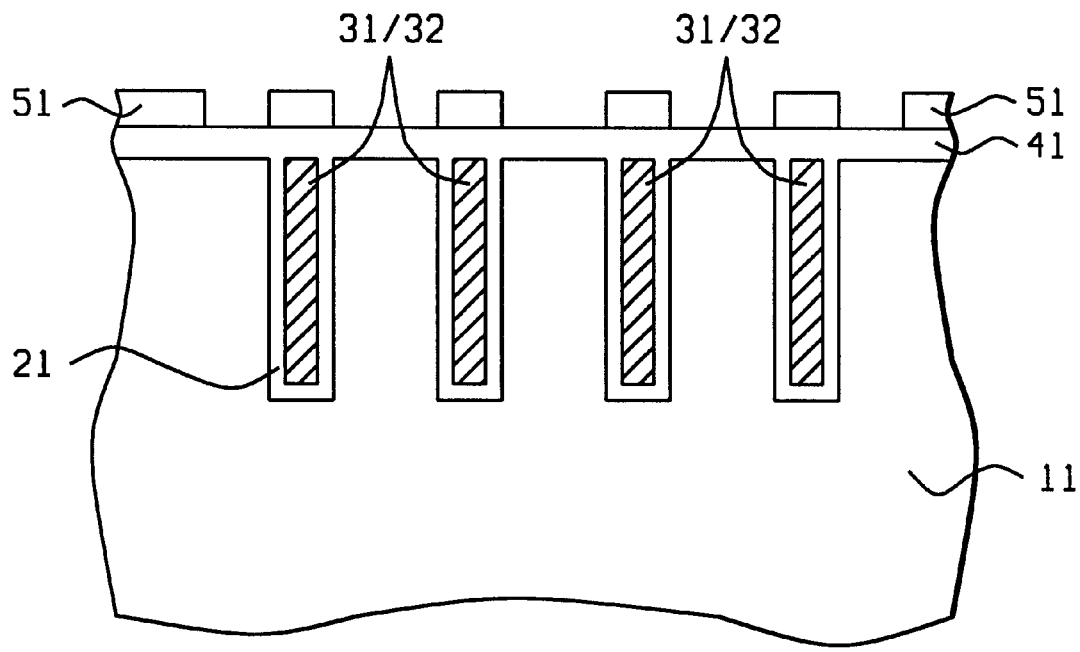
FIGS. 5 and 6 illustrate how a mask is used to etch a cavity around the filled trenches.
Figure 6:
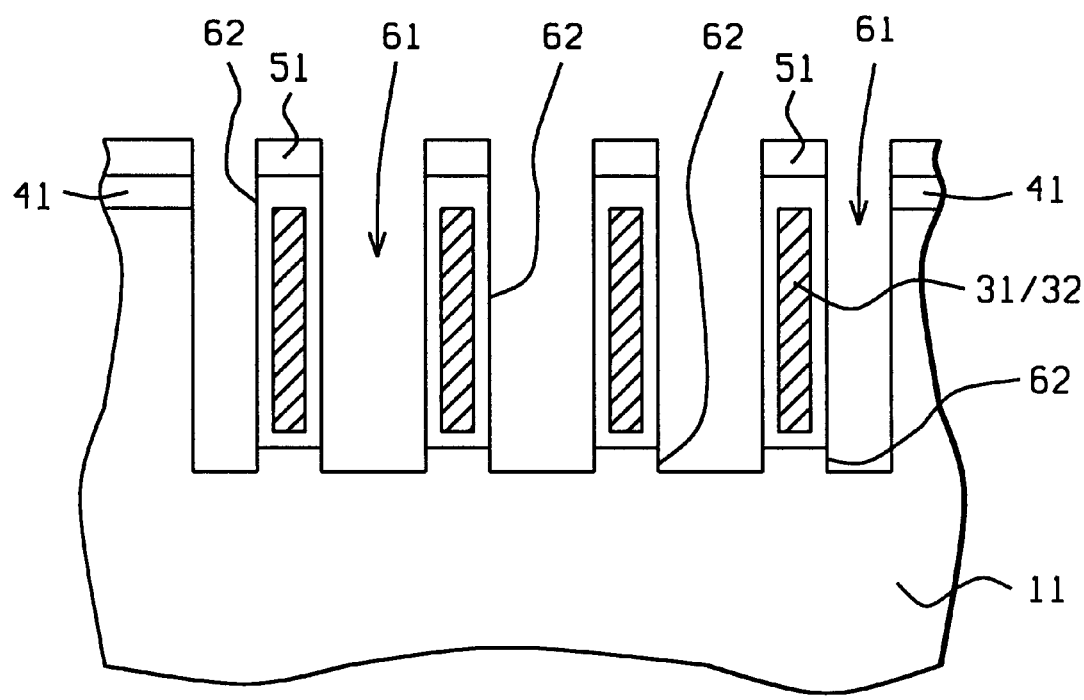

Finally, mask 51 is opened to etch silicon that is surrounding the polysilicon beams to form cavity 61 as shown in FIGS. 5 to 7.

3$^{rd}$ Embodiment (liner oxide isolation)

Figure 11:
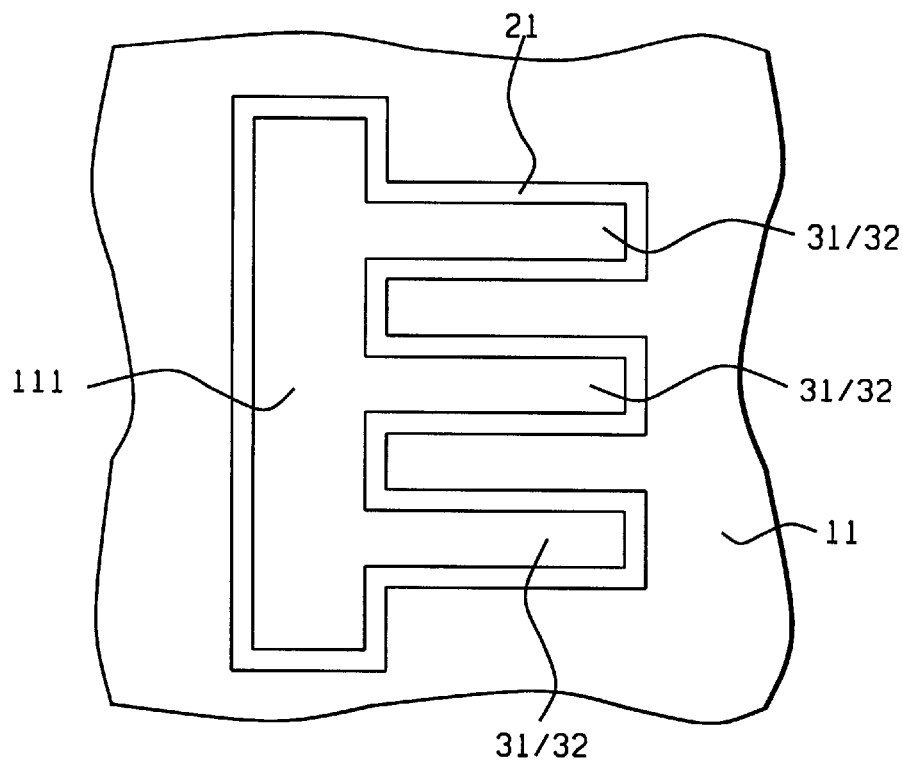
FIGS. 11 and 12 show two steps in implementing the second of three embodiments that teach how electrical contact may be made to the cantilever beams.
Figure 12:
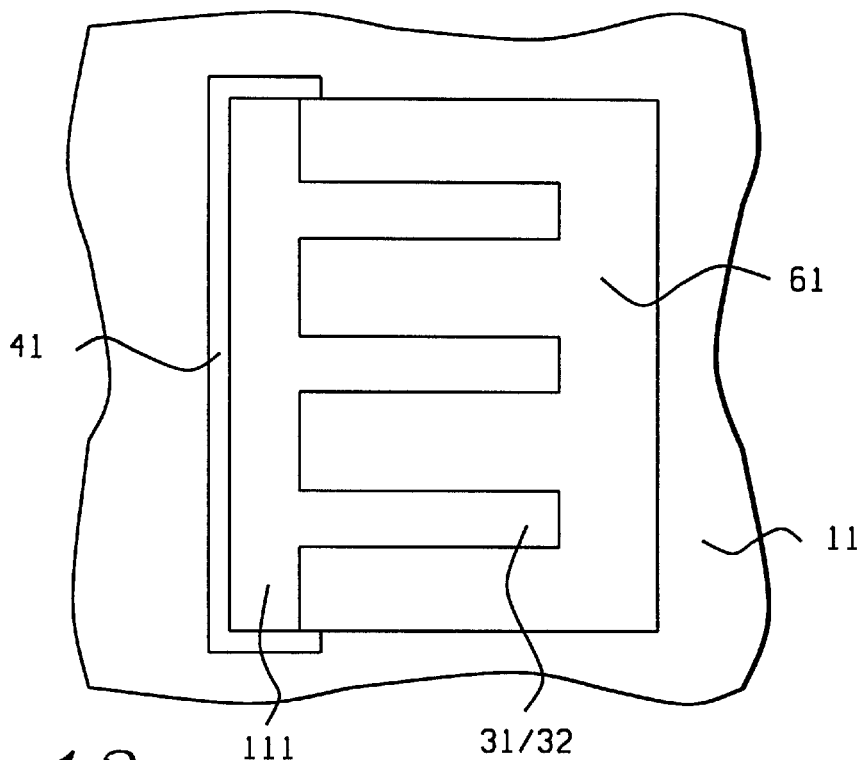

This embodiment uses the general process of the first embodiment with the following additional steps:

Referring now to plan view FIG. 11, at the time of forming the trenches that are to act as molds for the cantilever beams, an additional trench 111 is formed. This trench touches the other trenches (three in this example) and is at right angles to them. When cavity 61 is formed it is positioned so that trench 111 lies outside the opening 61 while trenches 31/32 lie entirely inside the opening (see FIG. 12). The liner oxide of the first embodiment is used as electrical insulation between the polysilicon inside trench 111 and silicon substrate 11. Liner oxide 21 is shown in FIGS. 11 and 12. After depositing oxide layer 41, as shown in FIG. 4, a contact window is opened on the polysilicon 111. Later, metall is deposited and patterned (103) as shown in FIG. 10. Finally, mask 51 is etched and silicon surrounding polysilicon beams 31/32 is etched to form 61, as shown in FIGS. 7 and 8.

4$^{th}$ Embodiment (oxide bar lateral isolation)

Figure 13:
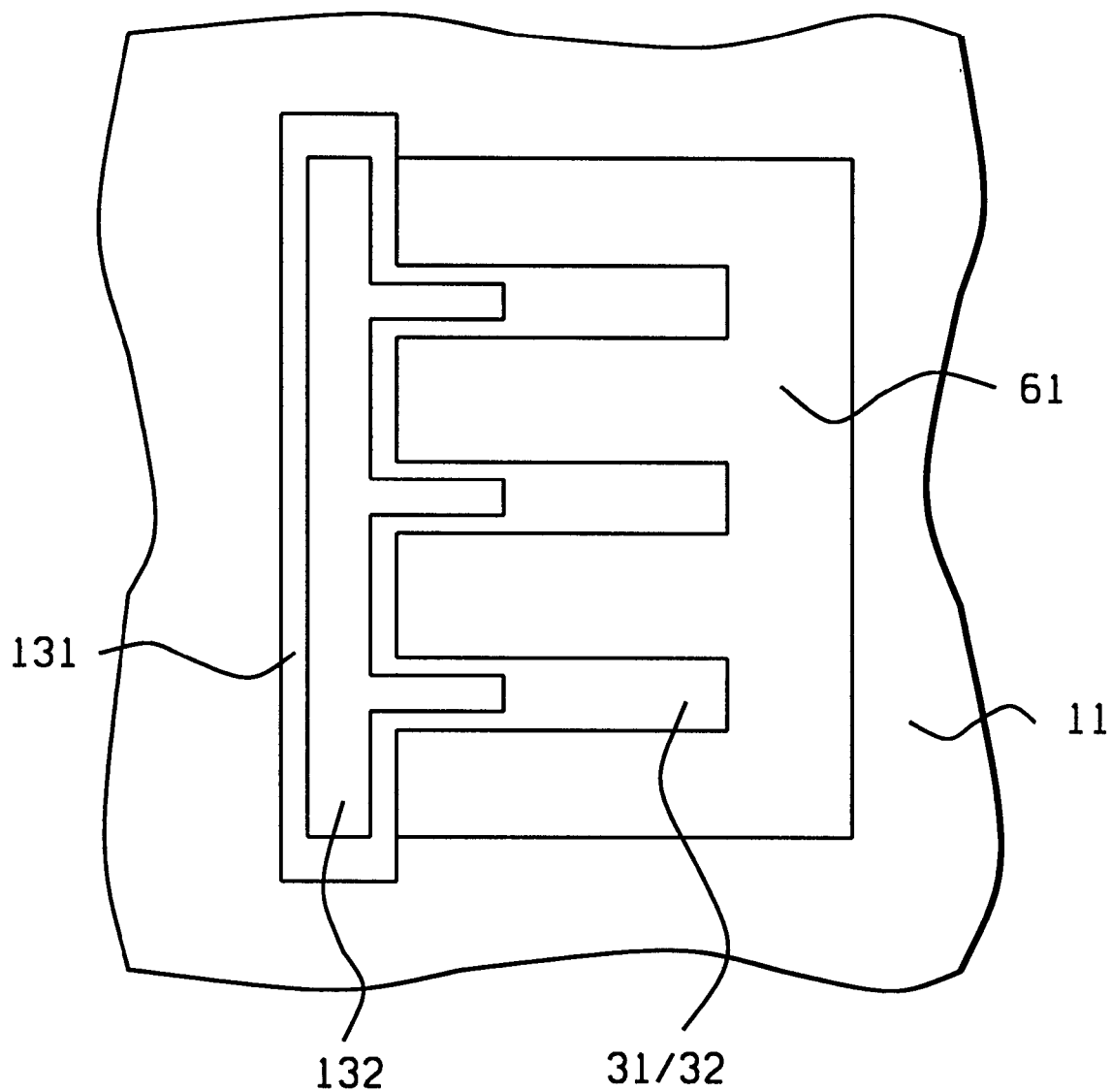
FIG. 13 illustrates the last of the three embodiments that teach how electrical contact may be made to the cantilever beams.

This embodiment uses the general process of the first embodiment but begins with the formation of a single trench to a depth between about 60 and 70 microns that is then just filled with silicon oxide. This is shown in FIG. 13 as trench 131. In a similar manner to the third embodiment, one or more trenches 31/32 that run at right angles to the oxide filled trench are then formed, as shown in FIG. 13. These touch the oxide filled trench and are used for the formation of the polysilicon beams as in all the previous embodiments. Before the lafter are formed, a metallic contact pad 132 that lies on trench 131 is formed. Said pad has 'fingers' that extend outwards part way along each beam's top surface in order to make electrical contact.

The four embodiments described above have been found to exhibit the following characteristics:

Compressive stress for low stress polysilicon after deposition was about $-1.28 \times 10^8$ dynes/cm$^2$. After POCl$_3$ doping, the second polysilicon deposition, and a final anneal, it dropped to about $-2.69 \times 10^7$ dynes/cm$^2$. The sheet resistance of the polysilicon after anneal was about 12.97 ohms/square.

In summary, the invention that we have described above offers the following advantages over the prior art:

(i) It is possible to achieve deep polysilicon beams with low residual stress as the polysilicon beams are formed by folding the film vertically.

(ii) Very large thicknesses of polysilicon beams can be achieved by depositing only between 1 to 3 micron thick polysilicon films. This results in low cost of production. In contrast, thick polysilicon beams have been traditionally achieved by thick depositions and etching the polysilicon away from the required structures (see, for example, the Bosch process).

(iii) Beam depth is uniform across the wafer as the beams are formed from a silicon mold.

(iv) No spacer oxide-tail issue arises in this process, as compared to the SCREAM or LISA processes. The present invention is CMOS compatible and hence can be integrated with a CMOS processes.

While the invention has been particularly shown and described with reference to the preferred embodiments thereof, it will be understood by those skilled in the art that various changes in form and details may be made without departing from the spirit and scope of the invention.

What is claimed is:

1. A process for forming a cantilever beam that is connected to, and electrically isolated from, a conductive body having an upper surface, comprising:

to a first depth below said upper surface, etching a trench, having a floor and sidewalls, and then coating said floor and sidewalls with a first layer of an insulating material;

just filling the trench with a conductive material of choice and then forming a second layer of insulating material over said upper surface;

on said second insulating layer, forming a mask that covers the filled trench and that defines an opening, said opening being disposed so that the filled trench lies partly inside and partly outside the opening;

through said mask, etching the conductive body to form a cavity that extends to a second depth below said upper surface, the second depth being greater than the first depth, thereby transforming that portion of the filled trench that is inside the cavity into a pedestal;

with the mask still in place, selectively removing all exposed conductive material thereby forming the cantilever beam through release of the pedestal from the cavity floor;

removing the mask and then selectively removing all exposed insulating material; and forming an electrical contact to the beam, said contact being electrically isolated from the conductive body.

2. The process described in claim 1 wherein the step of filling the trench with a conductive material is selected from the process group consisting of chemical vapor deposition, physical vapor deposition, and electroplating.

3. The process described in claim 1 wherein said material of choice is selected from the group consisting of polysilicon, aluminum, copper, and gold.

4. The process described in claim 1 wherein the insulating material is selected from the group consisting of silicon oxide and silicon nitride.

5. The process described in claim 1 wherein the conductive body is a semiconductor.

6. The process described in claim 1 wherein said material of choice is a magnetic material.

7. A process for forming an electrically isolated cantilever beam, comprising:

providing a silicon body having an upper surface;
depositing a first layer of silicon oxide on said upper surface and patterning said layer to form a busbar island having an edge;
forming first trenches, having a depth and located within the busbar island, that extend away from said edge and that are connected along a side opposing said edge, with silicon remaining between the first trenches;
through etching, releasing the silicon between the first trenches to form a first silicon beam and then filling said first trenches with silicon oxide;
to a first depth below said upper surface, etching a second trench, having a floor and sidewalls, said second trench originating at the busbar island edge and extending, parallel to said upper surface, outside said busbar island mask;
forming on said floor and sidewalls a second layer of silicon oxide;
under-filling the second trench with a first layer of low stress polysilicon and doping said first polysilicon to reduce its resistivity;
over-filling the second trench with a second layer of low stress polysilicon and then planarizing said second polysilicon layer whereby there is no polysilicon outside the trench;
forming a mask that covers the filled trench and that defines an opening, said opening being disposed to extend from the edge of the busbar island to fully encompass the filled trench;
through said mask, etching the conductive body to form a cavity that extends to a second depth below said upper surface, the second depth being greater than the first depth, thereby transforming the filled trenches that are within the cavity into pedestals; and
etching a contact hole through the busbar island to expose said first silicon beam and then forming a wiring pattern part of which makes contact to the silicon through said contact hole.

8. The process described in claim 7 wherein the silicon oxide that forms the busbar island is deposited to a thickness between about 1.5 and 3 microns.

9. The process described in claim 7 wherein the first layer of polysilicon is deposited to a stress level that is about $-1.28 \times 10^8$ dynes/cm$^2$.

10. The process described in claim 7 wherein the second layer of polysilicon is deposited to a stress level that is below about $-1.28 \times 10^8$ dynes/cm$^2$.

11. The process described in claim 7 wherein the step of doping the first layer of polysilicon further comprises adding phosphorus to the polysilicon by means of phosphorus oxychloride.

12. The process described in claim 7 wherein the first layer of polysilicon has a resistivity between about 10 and 12 ohm-cm.

13. The process described in claim 7 wherein the second layer of polysilicon has a resistivity between about 11 and 13 ohm-cm.

14. The process described in claim 7 wherein said first depth is between about 60 and 70 microns.

15. The process described in claim 7 wherein said second depth is between about 75 and 80 microns.

16. A process for forming electrically isolated cantilever beams, comprising:
providing a silicon body having an upper surface;
to a first depth below said upper surface, etching a first trench as well as a second trench that touches said first trench, each trench having a floor and sidewalls;
through thermal oxidation, forming on all said floors and sidewalls a layer of silicon oxide;
under-filling the trenches with a first layer of low stress polysilicon and doping said first polysilicon to reduce its resistivity;
over-filling the trenches with a second layer of low stress polysilicon and then planarizing said second polysilicon layer whereby there is no polysilicon outside the trenches;
depositing a second layer of silicon oxide over said upper surface;
on said second oxide layer, forming a mask that covers the first filled trench, that defines a contact window over, and within, in the second filled trench, and that defines an opening, said opening being disposed so that the first filled trench lies entirely inside the opening while said second filled trench lies entirely outside the opening;
through said mask, etching the silicon body to form a cavity that extends to a second depth below said upper surface, the second depth being greater than the first depth, thereby transforming the first filled trench into a pedestal;
with the mask still in place, selectively removing all exposed silicon, thereby forming the cantilever beam through release of the pedestal from the cavity floor; and
removing the mask and then depositing a layer of metal and then patterning said metal layer to form a contact pad over said contact window.

17. The process described in claim 16 wherein the first layer of polysilicon is deposited to a stress level that is about $-1.28 \times 10^8$ dynes/cm$^2$.

18. The process described in claim 16 wherein the second layer of polysilicon is deposited to a stress level that is below about $-1.28 \times 10^8$ dynes/cm$^2$.

19. The process described in claim 16 wherein the step of doping the first layer of polysilicon further comprises adding phosphorus to the polysilicon by means of phosphorus oxychloride.

20. The process described in claim 16 wherein the first layer of polysilicon has a resistivity between about 10 and 12 ohm-cm.

21. The process described in claim 16 wherein the second layer of polysilicon has a resistivity between about 11 and 13 ohm-cm.

22. The process described in claim 16 wherein said first depth is between about 60 and 70 microns.

23. The process described in claim 16 wherein said second depth is between about 75 and 80 microns.

24. A process for forming electrically isolated cantilever beams, comprising:
providing a silicon body having an upper surface;
to a first depth below said upper surface, etching a first trench and just filling said trench with silicon oxide;
to a second depth below said upper surface, etching a second trench that touches, said oxide filled trench, said second trench having a floor and sidewalls;
through thermal oxidation, forming on all said floors and sidewalls a layer of silicon oxide;
under-filling the second trench with a first layer of low stress polysilicon and doping said first polysilicon to reduce its resistivity;
over-filling the second trench with a second layer of low stress polysilicon and then planarizing said second polysilicon layer whereby there is no polysilicon outside the trenches;

on and within the oxide filled trench forming a metallic contact pad having fingers that extend along the polysilicon filled trench thereby making electrical contact thereto;

depositing a second layer of silicon oxide over said upper surface;

on said second oxide layer, forming a mask that covers the polysilicon filled trench, and the oxide filled trench and that defines an opening, said opening being disposed so that the oxide filled trench lies outside the opening and the polysilicon filled trench lie entirely inside the opening;

through said mask, etching the conductive body to form a cavity that extends to a third depth below said upper surface, the third depth being greater than the second depth, thereby transforming the second trench into a pedestal;

with the mask still in place, selectively removing all exposed conductive material, thereby forming the cantilever beam through release of the pedestal from the cavity floor; and removing the mask.

25. The process described in claim 24 wherein said first depth is between about 60 and 70 microns.

26. The process described in claim 24 wherein said second depth is between about 60 and 70 microns.

27. The process described in claim 24 wherein said third depth is between about 75 and 80 microns.

* * * * *